(12) United States Patent
Baur et al.

(10) Patent No.: US 8,769,709 B2
(45) Date of Patent: Jul. 1, 2014

(54) APPARATUS AND METHOD FOR ANALYZING AND MODIFYING A SPECIMEN SURFACE

(71) Applicant: Carl Zeiss SMS GmbH, Jena (DE)

(72) Inventors: Christof Baur, Darmstadt (DE); Klaus Edinger, Lorsch (DE); Thorsten Hofmann, Rodgau (DE); Gabriel Baralia, Darmstadt (DE)

(73) Assignee: Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 13/954,617

(22) Filed: Jul. 30, 2013

(65) Prior Publication Data

US 2014/0007306 A1    Jan. 2, 2014

Related U.S. Application Data

(63) Continuation of application No. PCT/EP2012/052693, filed on Feb. 16, 2012.

(60) Provisional application No. 61/443,366, filed on Feb. 16, 2011.

(30) Foreign Application Priority Data

Feb. 16, 2011  (DE) .......................... 10 2011 004 214

(51) Int. Cl.
*G01Q 10/00*  (2010.01)
(52) U.S. Cl.
CPC ...................................... *G01Q 10/00* (2013.01)
USPC .................................... 850/1; 850/40; 850/55
(58) Field of Classification Search
USPC ...................... 850/1, 22, 33, 40, 55
See application file for complete search history.

(56) References Cited

U.S. PATENT DOCUMENTS 5,336,887 A * 8/1994 Yagi et al. .................... 850/1
6,028,305 A   2/2000 Minne et al.

(Continued)

FOREIGN PATENT DOCUMENTS

| DE | 10 2007 023 435 | 11/2008 |
| JP | 6-148870 A | 5/1994 |
| WO | WO 02/080187 | 10/2002 |
| WO | WO 2009/039088 | 3/2009 |

OTHER PUBLICATIONS

M. Despont et al., "VLSI-NEMS chips for parallel AFM data storage," Sensors and Actuators 80 (2000) 100-107.
http://www.imec.be/ScientificReport/SR2009/HTML/1213442.html.

(Continued)

*Primary Examiner* — Kiet T Nguyen
(74) *Attorney, Agent, or Firm* — Fish & Richardson P.C.

(57) ABSTRACT

The invention refers to a probe assembly for a scanning probe microscope which comprises at least one first probe-adapted for analyzing a specimen, at least one second probe adapted for modifying the specimen and at least one motion element associated with the probe assembly and adapted for scanning one of the probes being in a working position across a surface of the specimen so that the at least one first probe interacts with the specimen whereas the at least one second probe is in a neutral position in which it does not interact with the specimen and to bring the at least one second probe into a position so that the at least one second probe can modify a region of the specimen analyzed with the at least one first probe.

20 Claims, 6 Drawing Sheets

(56) References Cited

U.S. PATENT DOCUMENTS

Figure 1:
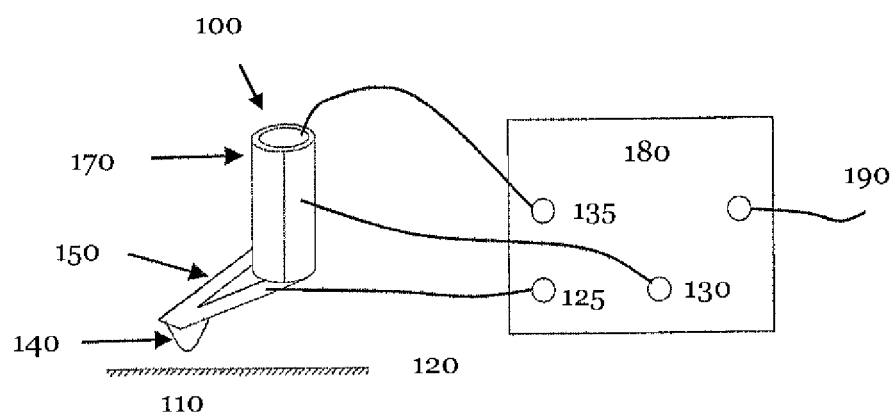

| | | |
|---|---|---|
| 6,353,219 B1 | 5/2002 | Kley |
| 7,281,419 B2 | 10/2007 | Wang et al. |
| 7,571,639 B2 | 8/2009 | Doi et al. |
| 7,597,717 B1 | 10/2009 | Lu et al. |
| 2004/0175631 A1 | 9/2004 | Crocker et al. |
| 2007/0022804 A1 | 2/2007 | Kley |
| 2007/0062264 A1 | 3/2007 | Wang et al. |
| 2009/0038383 A1 | 2/2009 | Nakaue et al. |
| 2010/0218284 A1 | 8/2010 | Jahnke |

OTHER PUBLICATIONS

International Search Report and Written Opinion for corresponding Appl No. PCT/EP2012/052693, mailed Apr. 23, 2012.

H. Prozidis et al., "Scanning Probes Entering Data Storage: From Promises to Reality", Emerging Technologies—Nanoelectronis, 2006, IEEE Conference, pp. 39-44, Jan. 10-13, 2006.

German Office Action, with translation thereof, for corresponding DE Appl No. 10 2011 004 214.8, dated Dec. 15, 2011.

International Preliminary Report on Patentability for corresponding PCT Appl No. PCT/EP2012/052693, dated Aug. 21, 2013.

\* cited by examiner

APPARATUS AND METHOD FOR ANALYZING AND MODIFYING A SPECIMEN SURFACE

1. TECHNICAL FIELD

The present invention refers to an apparatus and a method for analyzing and modifying a specimen. In particular, the invention refers to scanning probe microscopes which scan a specimen via a probe or its surface, and thus generating a one-dimensional or a two-dimensional representation of the topography of the specimen surface.

2. PRIOR ART

Scanning probe microscopes scan a specimen or its surface with a probe, and thus generate a one-dimensional or a two-dimensional representation of the topography of the specimen surface. In the following, scanning probe microscopes are abbreviated by SPM.

Depending on the kind of interaction, between the test prod and the specimen surface various SPM types are differentiated. Often, scanning tunneling microscopes (STM) are used applying a voltage between the probe and the test prod which are not in contact with each other, and the resulting tunneling current is measured. Thus, the application of the STM is restricted to conductive specimens or to specimens which have a conductive surface layer.

The atomic force microscope (AFM) or the scanning force microscope (SFM) does not have this restriction with respect to the specimen to be investigated. In this type of SPM, the probe or the test prod is deflected by atomic forces of the specimen surface, which are typically Van-der-Waals forces. The deflection of the test prod is proportional to the forces acting between the probe and the specimen surface, and this force is used for the determination of the surface topography.

Apart from this established SPM types, there is a variety of further device types which are used for specific application areas, as for example magnetic force microscopes or optical and acoustic scanning near-field microscopes.

It is also already known that scanning microscopes can be used for a specific modification of a specimen or its surface by a suitable design of the interaction between the test prod and the specimen. For example, the scientific report of the IMEC (Inter-University Micro Electric Center) (www.imec.be/ScientificReport/SR2009/HTML/1213442.htm) and the documents WO 2009/039088, JP 614887A, U.S. Pat. No. 7,571, 639 B2 and US 2007/0 022 804 A1 contain respective suggestions.

It has turned out that it is useful to apply various kinds of test prods which are optimized for the specific purpose in order to modify and to analyze a specimen or its surface with a SPM. The US 2007/0 022 804 A1 describes an apparatus which allows an automatic change of test prods as well as the determination and the removal of defective test prods.

However, in this document an exchange of the probe requires a complex readjustment and recalibration.

In order to increase the throughput for specific application fields, it is for example already known from the article "VLSI-NEMS chips for parallel AFM data storage" from M. Despont et al., in Sensors and Actuators, vol. 80, p. 100-107 (2000) and from the WO 02/080187 A1 to use probe arrays with a plurality of individual probes.

Up to now, the application of an arrangement or of an array of test prods or probes is restricted to a single specific application. This is a consequence of the specific test prods which are optimized for a specific processing function. Thus, a change in the task to be performed requires an exchange of the respective probe or the probe array.

The present invention is therefore based on the problem to indicate an apparatus and a method for analyzing and modifying a specimen which at least partially avoids the above mentioned drawbacks.

3. SUMMARY OF THE INVENTION

According to an application example of the present invention, this problem is solved by an apparatus according to claim 1. In one embodiment, the apparatus comprises a probe assembly for a scanning probe microscope having at least one first probe adapted to analyze a specimen, having at least one second probe adapted to modify the specimen, and at least one motion element associated with the probe assembly and adapted in order to scan one of the probes across the specimen surface being in a working position so that this probe interacts with the specimen, whereas the other probe is in a neutral position in which it does not interact with the specimen, and in order to bring a second probe into a position so that a region of the specimen which has been analyzed by the first probe can be modified with the second probe.

A probe assembly according to the invention has at least two probes or test prods which are optimized for the execution of different functions or tasks. Thus, this probe assembly comprises at least one probe which is designed for obtaining data across the specimen. For example, the design of the probe can comprise the geometry and the selection of the material of the analyzing probe. On the other hand, the support of this probe can be optimized for the achievement of this function. Moreover, the probe assembly according to the invention may comprise further analyzing probes which for example interact via another mechanism with the specimen in order to determine a comprehensive image of the specimen or its surface.

Moreover, a probe assembly designed according to claim 1 comprises a probe which is specifically designed to modify the specimen in a predetermined manner. Parameters for the design of a tip of such a probe are for example its outer shape, the choice of the material or a respective coating layer. Additionally, the support—which is often called canti-lever—of the analyzing probe is implemented so that the tip can optimally be used for fulfilling its predetermined function. In addition, a probe assembly according to the invention enables adapting the operation mode of the modifying probe to the function to be executed. Further, a probe assembly according to the invention may comprise a second or further probe(s) for executing a single processing function. For this reason, a function with various level of detail can be performed. A probe assembly realizing the characteristics of claim 1 can of course comprise probes which perform more than a single processing function. As a consequence, probe assemblies can be manufactured wherein individual probes are optimized for specific purposes.

Preferably only a single probe operates at each point in time for a probe assembly according to the invention, whereas the other probe(s) are in a neutral position in which the tip of these probes are preferably held in a distance from the specimen surface which is large enough in order to essentially avoid an interaction of these probes with the specimen. Thus, the technical effort for the insertion of the above defined probe assembly in a conventional scanning probe microscope is low. However, it is important that each of the probes can be quickly and reproducibly brought from its respective neutral position into a defined working position by the one or the several motion elements.

It is an essential advantage of the probe assembly according to the invention that the nano-world has not to be left when changing from the analyzing operation mode to a modifying operation mode. Rather, a shift of the probe array by the distance between the used probe and the probe which will be used next is sufficient. Therefore, the switching can be significantly accelerated compared to the prior art. Here, the nano-world is characterized by dimensions with length scales in the nanometer range, and thus by dimensions which are smaller than 1 μm.

In a further aspect, the motion element comprises a piezo actuator, in particular a tubular piezo actuator.

Piezo elements are presently already used in scanning probe microscopes. Thus, as already indicated, the integration of a probe assembly into an existing SPM does not require large modifications of the system. The piezo actuator can be dimensioned in such a manner that it holds the modifying probe in a distance from the specimen so that this probe cannot interact with the specimen while simultaneously scanning the analyzing probe in a defined distance across the specimen surface. Moreover, the piezo actuator can perform a shift of the probe assembly relative to the specimen after the analysis of a certain region of the specimen, so that a second probe can process the analyzed region of the specimen. In order to modify the position to be processed, the piezo actuator directs the analyzing probe to the specimen position to be processed and directs the modifying probe across the specimen surface for processing the measured specimen region.

According to a further aspect, the motion element has a control member for each probe which is applicable to bring the respective probe from the neutral position in a working position and vice versa.

In this embodiment of a probe assembly according to the invention, the flexibility of its possible applications is enhanced and at the same time the requirements with respect to the piezo element are lowered as each probe has its own control member which brings the probe from a neutral position into the processing position in a digital way. In the preferred embodiment, the probes are in the neutral position if no control signal is applied to the control member(s) and only the probe which is in operation is brought into the processing position or working position by applying a respective control signal. This embodiment minimizes the control effort for a probe assembly according to the invention.

The motion generated by the control member or each of the control members has only two binary states, namely (a) the probe is in the neutral position and (b) the probe is in the working position. Intermediate states which are between these states do not need to be adjusted which minimizes the requirements for the control of the control element(s).

In a preferred aspect, the control elements are applicable for changing the distance from a specimen surface to the at least one first probe and/or the at least one second probe by 100 nm, preferably by 500 nm and most preferably by 1000 nm wherein the distance corresponds to the distance between the neutral position and the working position.

By using the above defined distance between the probe(s) which are not in operation and the surface of the specimen, it is guaranteed that the probes which are in a neutral position neither come into contact with the specimen nor may even damage the specimen. In addition, this measure also reliably excludes that one of the probes can be modified or destroyed by an uncontrolled contact with the specimen. Moreover, the control element of the probe can be used in combination with a respective sensor element to scan the probe across the specimen in a closed control loop or to perform the processing function with a reproducible setting.

In another aspect the control member comprises a piezoelectric element and/or a bimetal element with a heating.

In a further aspect the at least one first probe and the at least one second probe are arranged to each other in a distance of 1000 μm to 50 μm, preferably of 500 μm to 100 μm, and most preferably of 250 μm to 200 μm. In still another preferred aspect, the probe assembly is applicable as a micro-electromechanical system in which the precision of the distance between the at least one first probe and the at least one second probe is known and is defined with a precision of less than 1 μm, preferably of less than 200 nm, and most preferably of less than 50 nm.

Manufacturing of a probe array according to the invention as a MEMS element (micro-electromechanical system) enables on the one hand a cost-effective manufacturing process and on the other hand an optimizing of the outer dimension of the probe array. As semiconductor processes have very small manufacturing tolerances, the distances of the individual probes or its respective tips can be predetermined with a high precision. Thus, the control effort is low for bringing the processing probe into a determined position within the region of the specimen to be measured with the analyzing probe. Therefore, as already explained above, the switching from the analyzing phase to the processing phase and vice versa can rapidly be performed.

In a further beneficial aspect, the at least one first probe is applicable to analyze excessive material on a surface of a specimen and the at least one second probe is applicable to remove the excessive material from the surface of the specimen.

In a further preferred aspect, a method for analyzing and modifying a specimen with a probe assembly of a scanning probe microscope comprises according to one of the above described aspects the following steps: (a) analyzing the specimen with a first probe by scanning the probe across the surface of the specimen via a motion element, (b) shifting the probe assembly and the specimen with the motion element relative to each other by the distance between the first probe and the second probe, and (c) modifying the specimen with the second probe based on data which have been determined in step (a). In another aspect, the shift of the probe assembly and the specimen relative to each other occurs by activating the motion element and/or by moving of the specimen table. According to a further aspect, step (a) is repeated after step (c).

Due to the short switch-over phase between analyzing and processing the specimen and as a consequence of the specific processing tools available in the probe array, the processing process can be interrupted, if needed, in order to control its progress and as appropriate to adapt the further processing to the present situation. This can for example be necessary if it is detected during the course of the processing that the specimen has an unknown composition below its surface.

In still a further aspect, the step of shifting of the probe assembly and the specimen relative to each other comprises: (a) turning off the control member of an operating probe, (b) retracting the probe assembly from the specimen with the motion element, (c) shifting the probe assembly and the specimen relative to each other by the distance between the probe put out of operation and the probe put into operation with the motion element and/or by moving of the specimen table, (d) switching on a control member of the probe being put into operation, and (e) returning the probe assembly to the specimen with the motion element. In an additional element, the step of turning on the control member comprises also setting of control parameters. Finally, in another preferred aspect the step of shifting the probe assembly and the specimen relative to each other comprises a period of less than 30 s, preferably of less than 20 s and most preferably of less than 15 s.

When above or below mentioning that the probe assembly and the probe are shifted relative to each other by the distance between two probes, it is meant that the amount of the relative shift corresponds with the distance of the two probes and the shift occurs in a direction so that after the shift has been performed, a probe which is put into operation is exactly at the position relative to the specimen at which the other probe which is put out of operation has been positioned prior to the shift.

As already mentioned, the principle according to the invention allows a switching back and forth between an analyzing operation mode and a processing operation mode without leaving the nano-world. The switching times which are attainable in this way are significantly less than half a minute, thus enabling the use of probe assemblies according to the invention in a manufacturing environment.

4. DESCRIPTION OF THE DRAWINGS

Figure 2:
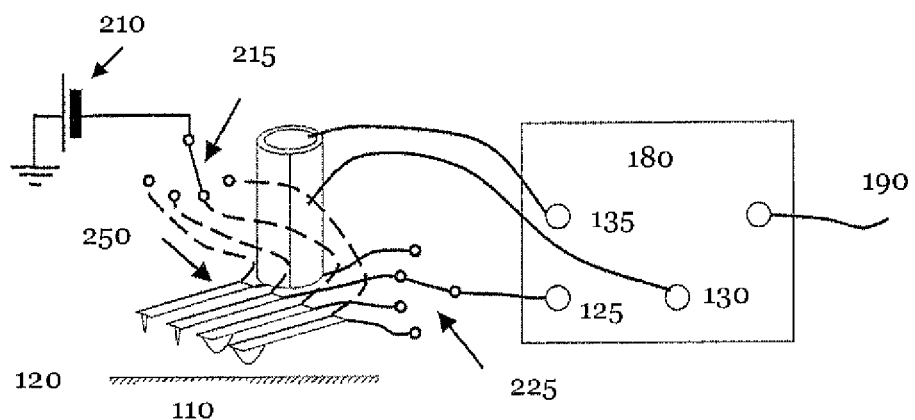
Figure 3:
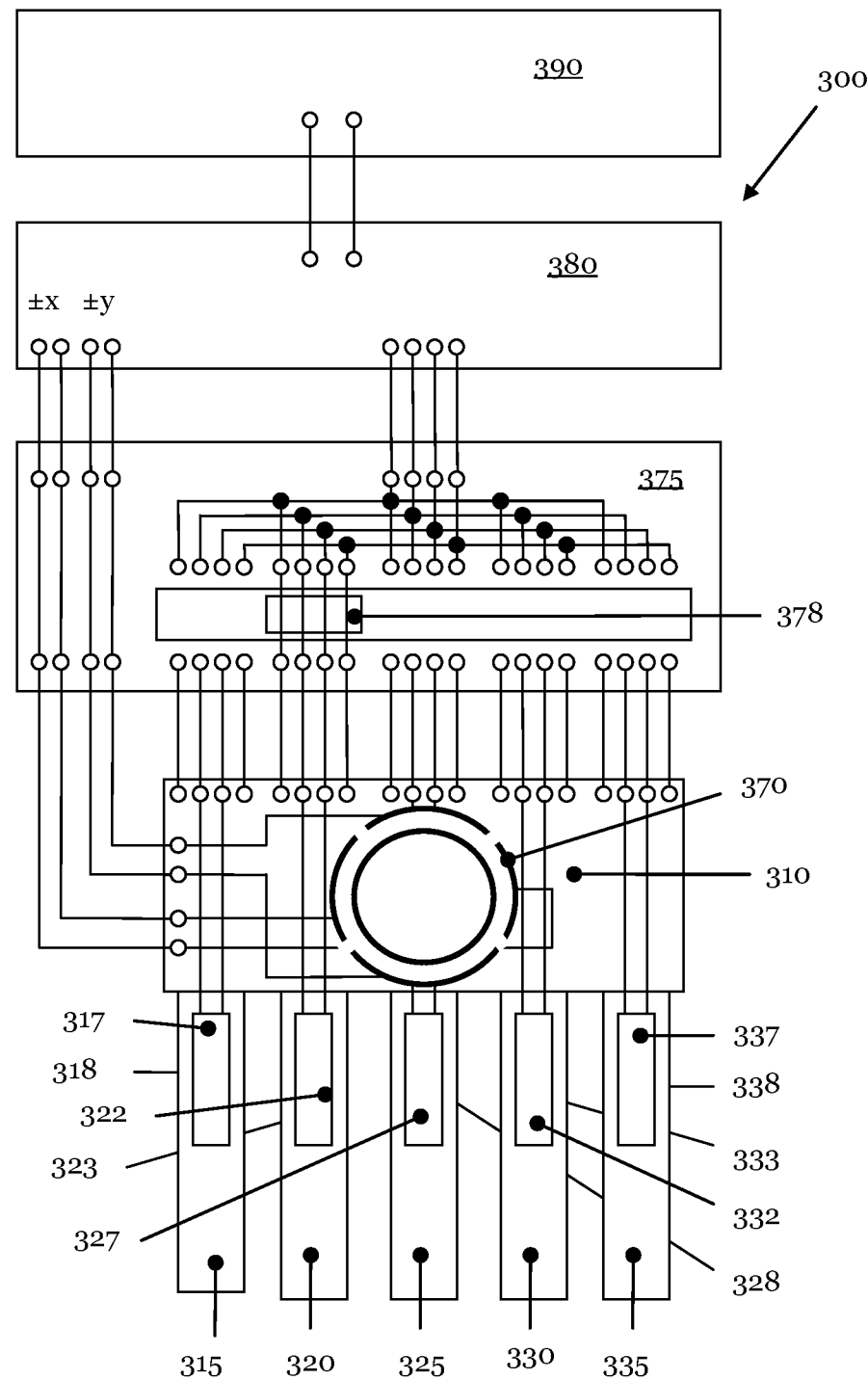
Figure 4:
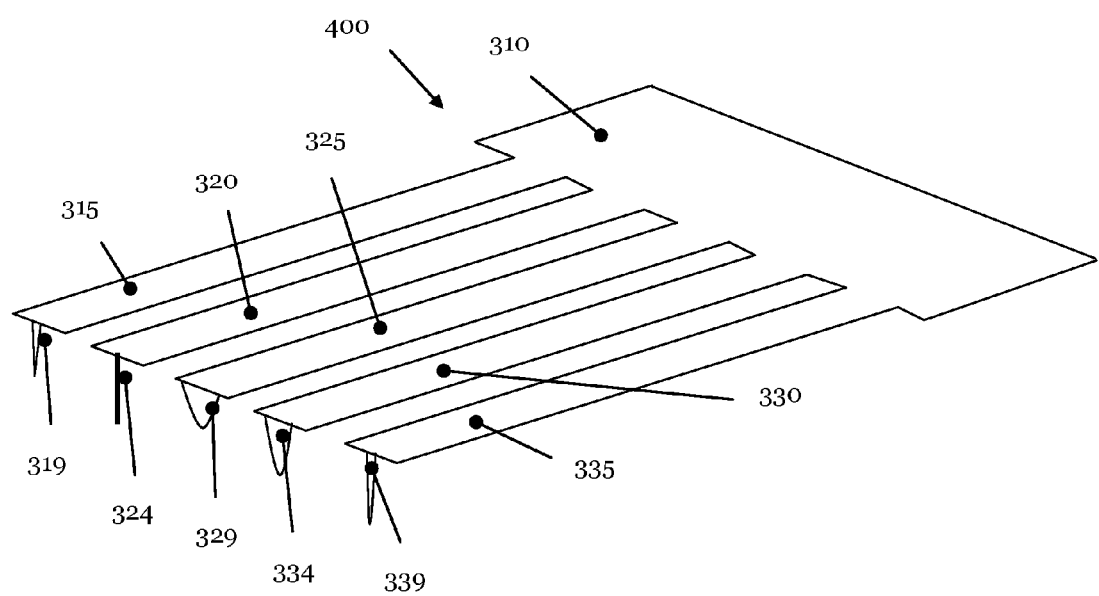
Figure 5:
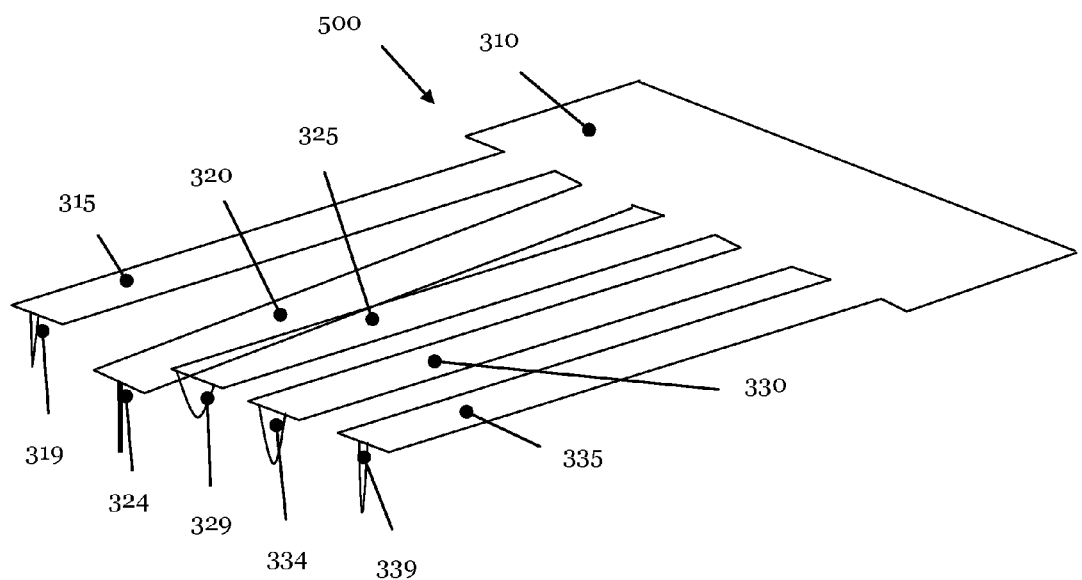
Figure 6A:
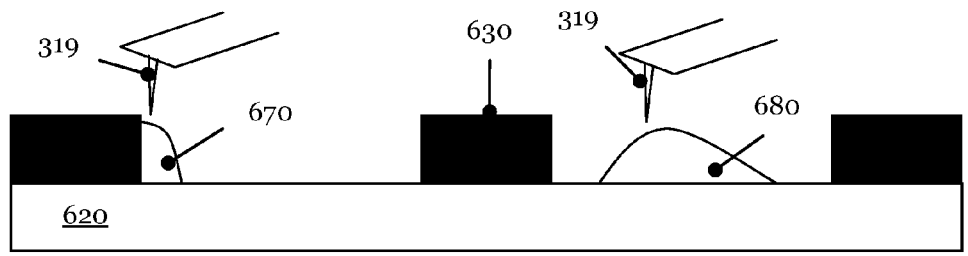
Figure 6A:
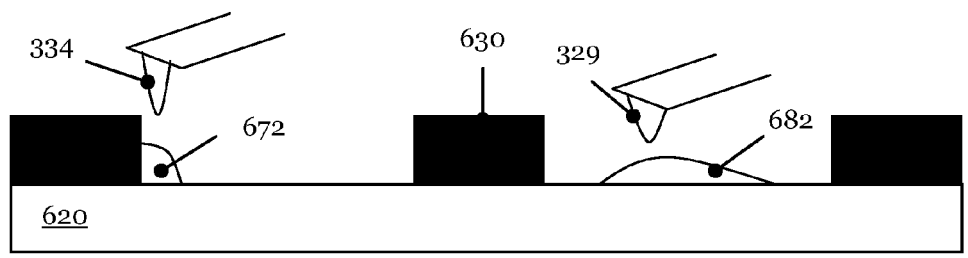
Figure 6A:
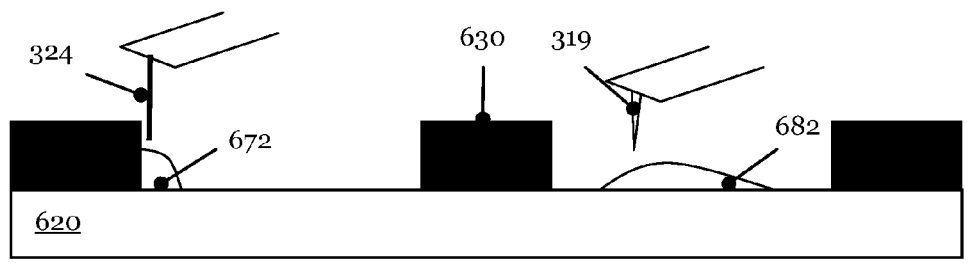
Figure 6B:
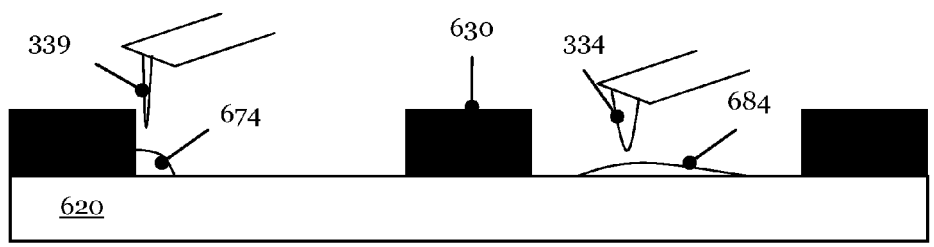
Figure 6B:
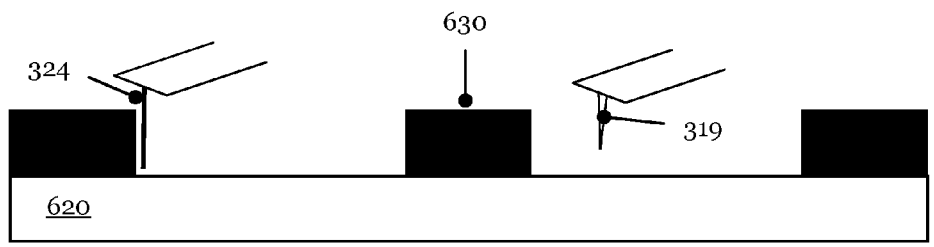

In the following detailed description presently preferred embodiments of the invention are described referring to the figures wherein FIG. 1 shows a schematic representation of some important components of a scanning probe microscope of the prior art;

FIG. 2 represents a schematic representation of a scanning probe microscope of FIG. 1 with a probe assembly;

FIG. 3 schematically represents a representation of a top view of a probe assembly including the selector switch and the control unit;

FIG. 4 schematically illustrates an enlarged representation of a probe assembly with tips optimized for various functions;

FIG. 5 represents FIG. 4 with one probe which has been lowered from the neutral position into a working position;

FIG. 6a schematically shows a first portion of a sequence of a correction process of defects of a photomask; and FIG. 6b schematically shows a second portion of the sequence of the correction process of FIG. 6b.

5. DETAILED DESCRIPTION OF PREFERRED EMBODIMENTS

In the following, presently preferred embodiments of an apparatus according to the invention and of a method according to the invention are explained in more detail.

FIG. 1 schematically shows some components of a scanning probe microscope 100 according to the prior art. The scanning probe microscope 100 as well as a probe assembly according to the invention can be operated under ambient operations or in a vacuum chamber (not represented in FIG. 1). The specimen 120 is arranged on the specimen table 110. The specimen table 110 can be shiftable in one direction (for example in the z-direction), in two directions (for example in x-direction and y-direction), or in three directions by one or several micromanipulators or translation stages (not shown in FIG. 1).

The probe 150 or the test prod 150 comprises a tip 140 and a bar which is in the following called cantilever, as it is usual in this field. The cantilever of the probe 150 is mounted to the piezo actuator 170. The further end of the piezo actuator 170 is arranged at a holding device (not indicated in FIG. 1). The holding device comprises micromanipulators or translation stages which bring the probe 150 to the region of the specimen 120 to be investigated. Alternatively or additionally, the specimen table 110 can have micromanipulators or translation stages for this purpose (not shown in FIG. 1).

The probe 150 further comprises a sensor element (not depicted in FIG. 1), which measures the deflection of the cantilever of the probe 150. The signal of the sensor element is in contact with the input 125 of the control unit 180 of the SPM 100. The control unit 180 can output a respective control input to the piezo actuator 170 via the output 135 of the control unit 180. Thereby, the piezo actuator 170 can be operated in a closed control loop. The control unit 180 can further output a signal to the piezo actuator 170 via the output 130, so that the tip of the probe scans across the specimen 120 in order to determine a one-dimensional or a two-dimensional contour of the specimen surface.

In the design illustrated in FIG. 1, the piezo actuator 170 has a tubular form and has four outer electrodes and one inner electrode. Piezo actuators 170 are available in various versions. For moving a probe assembly according to the invention, all designs beside the tubular form can be used which can execute the necessary motions of the tip 140 of the probe 150. In particular, the piezo actuator 170 can comprise various segments, so that the motions in the x/y plane and perpendicular to this plane can be controlled by separate electrical contacts (not shown in FIG. 1).

FIG. 2 shows four probes 250 of a probe array wherein each of the probes 250 comprises a sensor element similar to FIG. 1. The power supply 210 is applied to one of the sensor elements of the probes 250 via the switch 215. With the help of the switch 215 the signal of the sensor elements is applied to the input 125 of the control unit 180 of the SPM 100. Using the position of the switch, a particular probe can be selected from all probes of the probe array, of which the sensor element is connected to the power supply 210 and to the input 125 of the control unit 180. Thereby, a closed feedback or control loop can be setup for each probe 250, as it is for example described in FIG. 1 of the individual probe 150.

FIG. 3 schematically shows a top view of a probe array 310 according to the invention and its electrical connections to the control unit 380 of the scanning probe microscope 100 of FIG. 1. In contrast to the example of FIG. 2, the probe assembly 310 comprises in the example of FIG. 3 five probes 315, 320, 325, 330 and 335 being arranged in parallel. Analogously to FIG. 2, the piezo actuator 370 is arranged on the probe array 310. The opposite end of the piezo actuator 370 is fixed to a holding apparatus of the SPM 100 of FIG. 1 (not shown in FIG. 3).

FIG. 3 schematically depicts six connections for the motion of the piezo actuator 370. For clarity reasons, the two connections for the motion in z-direction are not shown which are connected with the inner metallization of the piezo actuator 370. Using the six connections, the control unit 380 of the scanning probe microscope 100 can control both, the motion of the piezo actuators 370 in the plane of the probe assembly 310 (x/y plane) and in the perpendicular direction (z-direction). Further, as explained in the above the discussion of FIG. 1, when applying electrical signals to the x-connection and/or the y-connection of the piezo actuator 370, the control unit 380 scans the probes 315, 320, 325, 330, and 335 across the specimen parallel to the plane of the probe assembly 310 120 and/or additionally moves the probes in the perpendicular z-direction.

Moreover, the piezo actuator 370 enables the execution of a controlled and reproducible movement of the probe assembly 310 relative to the surface of the specimen 120 of FIGS. 1 and 2.

The control members or the motion elements 317, 322, 327, 332, and 337 are arranged at the top sides of the cantilever of the probes 315-335. When applying respective control signals from the control unit 380 to the control members 317, 322, 327, 332, and 337, the control unit enables the control members 317, 322, 327, 332, and 337 to bring the cantilever of the respective probe 315-335 from the neutral position in the working position or operating position. The control members 317-337 can for example be made as a piezo actuator or as a bimetal element with a resistive heating. Due to the electrical energy converted into heat, the resistive heating deflects the cantilever of the probe 315-335 in a defined manner in a predetermined direction. Presently, it is preferred to implement each of the control members 317-337 as a digital element having two defined states (which means that it is binary implemented), namely having a defined neutral position and a defined working position. Further, the control members 317-337 comprise the function to switch between the neutral position and the working position. However, each of the control members 317-337 can also be designed as an element which has more than two defined states, so that the control element can stimulate oscillations of the cantilever of the respective probe 315-335, for example at its resonance frequency.

As already mentioned at the discussion of FIGS. 1 and 2, sensor elements 318, 323, 328, 333, and 338 are arranged at the cantilevers of the probes 315-335 of the probe assembly 310. In the example of FIG. 3, these are arranged at the lower sides of the cantilever of the probes 315-335, and can therefore not be seen in the top view of FIG. 3. In FIG. 3, their position is indicated by lines without end points. Each of the sensor elements 318-338 detects the bending of the respective cantilevers caused by the bending of the piezo actuator 370, the bending of the cantilever caused by the control members 317-337 associated with the cantilevers as well as an additional bending of the cantilevers caused by an action of a force between the specimen and the probe 315-335. Thus, the sensor elements 318-338 detect the position of the tips arranged at the free end of the cantilever. For example, the sensor elements 318-338 can be implemented as piezo resistive elements in a Wheatstone bridge circuit.

The arrangement of the control members 317-337 and the sensor elements 318-338 on the cantilever of the probes 315-335 can be exchanged with respect to the arrangement of FIG. 3. Moreover, both the control member 317-337 and the sensor element 318-338 can be arranged on one side of the cantilever of the probe 315-335.

As already explained in the context of FIGS. 1 and 2, using measurement data of the respective sensor element 318-338, a closed control loop can be set up for the respective operating probe 315-335. Thus, the individual probes 315-335 of the probe array 310 can operate in the various operation modes of the individual probe 150 of FIG. 1.

In the example of FIG. 3, in order to keep the modification effort for the installation in a probe assembly 310 according to the invention low, a selector switch 375 is available between the probe array 310 and the control unit 380 of the SPM 100 of FIG. 1. Thus, the control unit 380 of the SPM 100 can be left unchanged with respect to the control unit 380 if an individual probe 100 is operated. The selector switch 375 interconnects the operating probe 315-335 of the probe array 310 with the control unit 380 of the SPM 100 by shifting the switch 378. In the example shown in FIG. 3, the probe 320 is in the working position whereas all other probes 315, 325, 330, and 335 are in their neutral positions.

Electrical or mechanical switching elements can be used as selector switch 375. In contrast to the exemplary representation of FIG. 3, it is not necessary to direct the electrical connections of the control members 317-337 through the selector switch 375. Rather, these connections may be directly connected to the control unit 380. This allows reducing the dimensions of the selector switch 375 and significantly reduces the requirements for the selector switch 375, in particular with respect to its electric strength.

Apart from the minor modification of the scanning probe microscope 100, the embodiment of FIG. 3 has the advantage that electrical signals apply to only one of the probes 315-335 of the probe array 310. A mutual influence or a distortion of the signals of the probes 315-335 being operated in parallel is thus excluded.

However, a probe assembly 310 according to the invention can also be operated without the selector switch 375 by directly connecting the electrical connections of the probes 315-335 with a modified control unit of the SPM 100. Thus, two or all probes 315-335 can be operated or controlled in parallel by a modified control unit of the SPM 100.

The computer system 390 controls the operation of the probe assembly 310 via the control unit 380.

FIG. 4 shows a side view of the probe assembly 310 of FIG. 3, so that the tips 319, 324, 329, 334, and 339 of the probes 315-335 of the probe assembly 310 can be seen. Two tips 319 and 324 of the probes 315 and 320 are applicable for analyzing the specimen 120. One of these tips 319 tapers towards its lower end (i.e. tapers with increasing distance from the cantilever) and has a spiky end. This secures a high position resolution when scanning the specimen 120.

The tip 319 comprises the same material as the cantilever of the probe 315. For example, silicon or silicon nitride can be used as material of the cantilever. However, the probe array 310 can also be fabricated from any semiconductor material or from a combination of semiconductor materials which allow the manufacturing of MEMS (micro-electromechanical system). Alternatively, the probe and its tip can be also fabricated from a metal, a metal alloy or diamond.

Moreover, the tip 319 can have a coating in order to harden its surface for example, and thus to make it more durable. In addition, a coating allows adjusting the interaction of the tip 319 with the specimen 120. For example, when the SPM 100 is constructed in form of a scanning probe microscope, a good electrical conductivity of the tip is important, for such a case a coating can be designed with a high electrical conductivity. Further modifications of the tip 319 which have been developed for individual probes 315-335 can also be used for the probe tips 319-339 of the probe assembly 310.

The second analyzing probe 320 comprises a long needle-shaped tip 324. This needle-shaped tip 324 can comprise for example a carbon nano-tube. Via an adhesive, the tip 324 can be attached to the free end of the cantilever of the probe 320, or the tip 324 can be deposited via vapor phase deposition on the free end of the cantilever. Using this second analyzing probe 324, regions of the surface of the specimen 320 can be scanned which have a very large aspect ratio (i.e. a ratio of the depth or the height of a structure to its smallest lateral extension).

However, the tips for analyzing the specimen 120 are not restricted to the tips 319 and 324 of FIG. 4. Rather, the analyzing tip(s) can be adjusted to further types of SPM 100. Beside the tunneling current (scanning probe microscope) and the Van-der-Waals forces (scanning force microscope) many further physical quantities are used for the examination of a specimen. For example, a magnetic force microscope exploits the magnetic interaction between the specimen and the probe, in particular its tip. An acoustic scanning microscope uses phonons and an optical scanning near-field microscope uses photons for examining the specimen. This list of various SPM types is only exemplary and by no means exhaustive. However, all these SPM types have in common that their analyzing probe(s) as well as their modifying probe(s) are optimized for the respective kind of interaction. Further, the analyzing probe(s) can be optimally designed for each of the above mentioned SPM types.

Moreover, the probes used for analyzing the specimen 120 can additionally be adapted to the respective specimen or to specific process parameters. In addition to the above mentioned aspect ratio of the specimen, this can be the required spatial resolution with which the topography of the specimen shall be detected. Moreover, the optimization of the tip of the analyzing probe 315, 325 may depend upon whether the SPM 100 operates at ambient conditions, in a liquid or in vacuum.

Furthermore, the probes 325, 330, and 335 of the probe assembly 310 also comprise several tips 329, 334, and 339, which are designed for executing a processing function on the specimen 120. As it will subsequently be described in the context of FIG. 6, the processing tips or the modifying tips 329, 334, and 339 are designed for the removal of excessive material on a specimen 120 or specimen surface, for example on a photomask. For this purpose, the tips 329, 334 and 339 have different shapes. In the example of FIG. 6, the processing tips are in direct contact with the material of the specimen 120, therefore their surfaces should be harder than the surface of the specimen 120 in order to guarantee a sufficient lifetime of the modification tips 329, 334, and 339. This objective can be achieved by using tips of hard materials, as for example silicon nitride and/or by using tips which have a respective coating layer, The tips 329, 334 and 339 have different shapes, which allow different tradeoffs between the processing velocity on the one hand and the spatial resolution on the other hand. Moreover, it is important that the contact of the tips 329, 334, and 339 with the specimen 120 does not damage the surface of the specimen outside of the region to be processed.

The tip 329 of the first modifying probe 325 has a relatively large radius of curvature so that a large region of the specimen 120 comes into contact with this tip. Thus, the tip 329 allows the rapid removal of material across a large region. The tip 339 of a further modifying probe 335 is applicable to interact with the specimen 120 in a smaller region. Moreover, due to its length, the tip 339 of the probe 335 is suitable to be applied at positions of the specimen 120 which have a large aspect ratio. A tip 334 of still a further modifying probe 330 is a tradeoff between these two extremes.

Similarly as discussed for the analyzing probes 315 and 320, the modifying probes 325, 330, and 335 or their tips 329, 334, and 339 are optimized for the particular function to be performed.

For the probe assembly 310 represented in FIG. 1, both the analyzing probes 315 and 320 and the modifying probes 325, 330, and 335 are designed for a single function. However, a probe assembly according to the invention is not restricted to perform a single function. Rather, a probe array according to the invention can comprise probes which are optimized for the execution of several functions.

Furthermore, in the example of FIGS. 3 and 4, the probe array 310 has only accidentally five probes. The minimum number of probes or test prods for a probe assembly according to the invention is two: one probe for analyzing the specimen 120 and another one for modifying or processing of the specimen 120. The upper limit of the number of probes is given by the number of probes which can be fabricated in a MEMS.

FIG. 5 shows the probe assembly 310 of the FIGS. 3 and 4 in which the control unit 380 has moved one probe 320 from the neutral position in a working position by applying of a control signal and retains this probe into the working position. In the working position, the probe 320 is lowered by 500 nm relative to the neutral position. In the working position, the tip 324 of the probe 320 has a distance from the probe surface of 0 nm-50 nm. Thus, the tips 319, 329, 334, and 339 of the probes 315, 325, 330, and 335 which are in the neutral position have a distance to the surface of the specimen of approximately 500 nm-550 nm. This guarantees that if the analyzing tip 324 is dynamically operated by the piezo actuator 370 and if the cantilevers have soft spring constants, the other tips 319, 329, 334, and 339 do not reach the surface of the specimen.

FIG. 6 illustrates a method in which the probe array 310 according to the invention is used for the removal of defects of a photomask. In this example, the specimen is a transparent photomask 620 having on its front side a structure comprising an absorber material 630. Adjacent to the left absorber structure 630, the photomask 620 has a defect 670 comprising excessive material. Between the middle and the right absorber structure 630, the photomask 620 shows a further defect 680 due to erroneously deposited material.

As it is schematically depicted in the upper partial image of FIG. 6a, the method begins with an analysis of the photomask 620 by scanning the mask surface with the SPM 100 of FIG. 1 in which the probe assembly 310 of FIGS. 3 to 5 is integrated. In the first step, the photo mask 620 is scanned with an analyzing probe 315. After the evaluation of the scan data by the computer system 390 reveals that the defect is in direct contact with an absorber structure, the defect is again scanned with the second analyzing probe 320 which is applicable for the analysis of structures with a high aspect ratio (not represented in FIG. 6a).

The second partial image of FIG. 6a illustrates the removal of the defect 680 with the probe 325 and the respective tip 329. The coarse tip 329 which can rapidly remove material of the defect is used since the analysis of the defect 680 has revealed that this defect is not in direct contact with an absorber element. On the other hand, for the removal of the defect 620 adjacent to an absorber element, at first the probe 330 with the tip 334 is used. The choice of the probe 330 provides a tradeoff between the removal rate and the processing and the spatial resolution.

The transition from the analyzing mode of the upper partial image of FIG. 6a to the modifying mode or processing mode of the middle partial image comprises a change from an analyzing probe 315 or 320 to one of the modifying probes 325, 330 or 335. Such a change is now exemplarily explained via the transition of the analyzing probe 315 to the processing probe 335. The process begins with the turning off of the control member 317 of the probe 315. As a result, the probe 315 moves from the working position to the neutral position. In the next step, the probe array 330 is retracted from the photomask 620 with the help of the piezo actuator 370. In this way, the distance between the surface of the photomask 620 and the tips 319, 324, 329, 334, and 339 is increased so that the subsequent shift of the probe array 310 by the distance between the interchanged probes 315 and 325 can be performed without any contact between the tips 319-329 of the probes 315-335 and the photomask 620. In an alternative implementation of the SPM 100, the micromanipulator or the translation stage arranged at the specimen table 110 executes this step by moving the specimen table 110. These two steps can each be executed within one second.

Then, the piezo actuator 370 shifts the probe assembly 310 by the distance between the analyzing probe 315 and the modifying probe 325. In an alternative embodiment, micromanipulators or translation stages attached to the specimen table 110 shift the specimen table 110 by the distance between the analyzing probe 315 and the modifying probe 325. The lateral motion of the specimen table 110 can for example be executed by one or several servo devices. It is also possible to realize the shift of the probe array 310 and the specimen 120, 620 relative to each other by the distance between the probes 315 and 325 by a simultaneous motion of the specimen table 110 and the probe assembly 310. This shift process is completed after some seconds.

Thereafter, the control member 327 of the probe 325 is switched on. This step occurs within a fraction of a second.

An optional portion of the entire probe exchange is the setting or the optimization of the control parameters for the probe 325. Among others, this step has to be performed at the first application of the probe 325 for the photomask 620, or for the case that a previous analyzing process detected that the defect 682 deviates from the expected shape. For the setting of the control parameters for the probe 325, a period of some seconds is estimated.

As a final step of the probe exchange process, the piezo actuator 370 again returns the probe assembly 310 close to the photomask 620. In an alternative embodiment, this step can be performed by a micromanipulator of the specimen table 110. The time duration of this last step amounts again to some seconds.

The following table summarizes the sequence of a probe exchange.

TABLE 1

Temporal sequence of a probe change

| Step | Description | Time | Opt. |
|---|---|---|---|
| 1 | Switching off the control member 317 | <1 s | |
| 2 | Retracting the probe assembly 310 | <1 s | |
| 3 | Shifting the probe assembly 310 | <5 s | |
| 4 | Turning on the control member 327 | <1 s | |
| (5) | Setting the parameter of the element 327 | | <5 s |
| 6 | Returning the probe assembly 310 | <10 s | |
| | Total: | <18 s | <23 s |

After a processing time which depends on the shape, the size and the material of the defect as well as the applied modifying probe 325, 330 or 335, the processing of the defects 670 and 680 is interrupted and the remaining defects 672 and 682 are again analyzed with the help of the analyzing probes 315 (for the defect 672) and 320 (for the defect 682). This method step is schematically represented in the lower partial image of FIG. 6a.

On the basis of the data gained by the measurement of the remaining defects 672 and 682 and the analysis performed by the computer system 390 of the measurement data, the processing of the remaining defects 672 and 682 is continued. The upper partial image of FIG. 6b schematically shows the removal of the remaining defect 674 by the probe 335 with the tip 339 and the removal of the remaining defect 684 by the probe 330 with the tip 334. Due to the specific position of the defect 674 the probe 335 is used for its processing, wherein its tip 339 is designed for an application in an environment with a large aspect ratio.

The remaining defect 684 is removed with the probe 330 and the tip 334 which is a compromise between a rapid removal of the excessive material of the defect 684 on the one hand and a gentle treatment of the transparent surface of the photomask 620 on the other hand.

After the expiration of the processing time, which has been determined from the data of the second analyzing step, the surface of the photo mask 620 is again investigated with the analyzing probes 315 and 320 of the probe array 310 to secure that the defects 674 and 684 have been completely removed. In case the analysis data should reveal that there are still residues of the defects 674 and 684 on the photomask 620, these residues are removed in a further processing step with one of the processing probes 325, 330 or 335. The success of the further processing step is again controlled by a subsequent analyzing step.

The success of the complete removal of the different defects 670 and 680 of the example of FIGS. 6a and 6b is essentially based on the availability of adapted analyzing and processing tools. However, it is of fundamental importance to rapidly switch between an analyzing mode and a processing mode without the need to leave the nano-world, as it is enabled by the probe assembly 310 according to the invention.

By reference to the FIGS. 6a and 6b, the invention has been explained via the example of repairing a photomask. The invention can of course also be used for other applications at which specific particles are to be removed from a surface or in which they are at least to be mobilized to such an extent that they can easily be moved across the specimen surface.

The invention claimed is:

1. A probe assembly, comprising:
a first probe, the first probe having a neutral position in which the first probe does not interact a specimen, and the first probe having a working position in which the first probe is configured to analyze the specimen;
a second probe, the second probe having a neutral position in which the second probe does not interact with the specimen, and the second probe having a working position in which the second probe is configured to modify the specimen; and
a motion element configured to scan the first probe across a surface of the specimen when the first probe is in its working position and the second probe is in its neutral position, the motion element also being configured to bring the second probe into its working position so that a region of the specimen analyzed with the first probe is modifiable with the second probe,
wherein the probe assembly is a scanning probe microscope probe assembly.

2. The probe assembly of claim 1, wherein the motion element comprises a piezo actuator.

3. The probe assembly of claim 1, wherein the motion element comprises a tubular piezo actuator.

4. The probe assembly of claim 1, wherein the motion element further comprises first and second control members, the first control member being configured to move the first probe between its neutral position and its working position, and the second control member being configured to move the second probe between its neutral position and its working position.

5. The probe assembly of claim 4, wherein a distance between the working position of the first probe and the neutral position of the first probe is at least 100 nm.

6. The probe assembly of claim 5, wherein a distance between the working position of the second probe and the neutral position of the second probe is at least 100 nm.

7. The probe assembly of claim 4, wherein a distance between the working position of the second probe and the neutral position of the second probe is at least 100 nm.

8. The probe assembly of claim 4, wherein the control member comprises a piezoelectric element.

9. The probe assembly of claim 4, wherein the control member comprises a bimetal element with a heating.

10. The probe assembly of claim 1, wherein the first and second probes are arranged at distance from each other which is 1000 µm to 50 µm.

11. The probe assembly of claim 10, wherein the probe assembly is a micro-electromechanical system, and the first and second probes are arranged at distance from each other which is known with a precision of less than 1 µm.

12. The probe assembly of claim 1, wherein the first probe is configured to analyze excessive material on a surface of the specimen, and the second probe is configured to remove the excessive material from the surface of the specimen.

13. A method, comprising:
 a) analyzing a specimen with a first probe of a scanning probe microscope probe assembly by scanning the first probe across a surface of the specimen using a motion element;
 b) using the motion element to shift the probe assembly and the specimen relative to each other by a distance between the first probe and a second probe of the scanning probe microscope probe assembly; and
 c) modifying the specimen with the second probe based on data determined in a).

14. The method of claim 13, wherein b) comprises actuating the motion element.

15. The method of claim 14, wherein b) further comprises moving a specimen table.

16. The method of claim 13, wherein b) comprises moving a specimen table.

17. The method of claim 13, further comprising, after c), repeating a).

18. The method of claim 13, wherein b) comprises:
 b1) putting one of the probes out of operation;
 b2) retracting the probe assembly from the specimen using the motion element;
 b3) shifting the probe assembly and the specimen relative to each other by a distance between the out of operation probe on and the other probe using the motion element and/or by moving the specimen table;
 b4) turning on a control member of the other probe; and
 b5) returning the probe assembly to the specimen using the motion element.

19. The method of claim 18, wherein b4) comprises setting control parameters.

20. The method of claim 13, comprising performing b) within a period of less than 30 seconds.

* * * * *

UNITED STATES PATENT AND TRADEMARK OFFICE
CERTIFICATE OF CORRECTION

| | | |
|---|---|---|
| PATENT NO. | : 8,769,709 B2 | Page 1 of 1 |
| APPLICATION NO. | : 13/954617 | |
| DATED | : July 1, 2014 | |
| INVENTOR(S) | : Christof Baur et al. | |

It is certified that error appears in the above-identified patent and that said Letters Patent is hereby corrected as shown below:

On Title Page 2, col. 2, line 4, under OTHER PUBLICATIONS delete "Nanoelectronis" and insert --Nanoelectronics--.

In the Specification:

Col. 1, under the title, insert the following:

--Cross-Reference to Related Applications

The present application is a continuation of, and claims benefit under 35 USC 120 to, international application PCT/EP2012/052693, filed Feb. 16, 2012, which claims benefit under 35 USC 119 of German Application No. 10 2011 004 214.8, filed February 16, 2011 and U.S. Provisional Application No. 61/443,366, filed February 16, 2011. The entire disclosure of international application PCT/EP2012/052693 is incorporated by reference herein.--.

Signed and Sealed this
Thirtieth Day of September, 2014

Michelle K. Lee
*Deputy Director of the United States Patent and Trademark Office*